(12) United States Patent
Schroeder

(10) Patent No.: US 7,545,422 B2
(45) Date of Patent: Jun. 9, 2009

(54) IMAGING SYSTEM

(75) Inventor: Dale W. Schroeder, Scotts Valley, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 760 days.

(21) Appl. No.: 10/974,077

(22) Filed: Oct. 27, 2004

(65) Prior Publication Data

US 2006/0087572 A1 Apr. 27, 2006

(51) Int. Cl.
*H04N 9/083* (2006.01)
*G02B 5/22* (2006.01)
*G02B 3/00* (2006.01)

(52) U.S. Cl. .................. 348/279; 348/277; 359/891; 359/723

(58) Field of Classification Search .................. 348/279, 348/235, 342, 290, 289, 273, 336, 278, 340, 348/360; 359/308, 339, 359, 502, 590, 723, 359/891; 356/239.2, 10, 414–416, 419
See application file for complete search history.

(56) References Cited

U.S. PATENT DOCUMENTS

| | | | |
|---|---|---|---|
| 5,251,067 A | 10/1993 | Kamon | |
| 5,444,236 A * | 8/1995 | Ludington et al. | 250/208.1 |
| 6,229,913 B1 * | 5/2001 | Nayar et al. | 382/154 |
| 6,313,949 B1 | 11/2001 | Itoh et al. | |
| 6,332,684 B1 * | 12/2001 | Shibatani et al. | 353/31 |
| 6,531,044 B1 * | 3/2003 | Anazawa et al. | 204/603 |
| 6,717,735 B2 * | 4/2004 | Smith | 359/626 |
| 6,833,873 B1 * | 12/2004 | Suda | 348/340 |
| 2002/0122124 A1 * | 9/2002 | Suda | 348/263 |
| 2004/0174446 A1 * | 9/2004 | Acharya | 348/279 |
| 2005/0068415 A1 * | 3/2005 | Kremen | 348/51 |

* cited by examiner

*Primary Examiner*—Lin Ye
*Assistant Examiner*—Euel K Cowan
(74) *Attorney, Agent, or Firm*—Ratner Prestia

(57) ABSTRACT

An imaging system comprising a filter array adapted to filter electromagnetic waves, a lens array adapted to focus electromagnetic waves, and an image sensor configured to receive the focused electromagnetic waves. The filter array and the lens array are configured into elements that filter and focus electromagnetic waves that represent an object image window onto portions of the image sensor and each portion of the image sensor receives filtered electromagnetic waves that represent the object image window from one of the elements.

19 Claims, 4 Drawing Sheets

IMAGING SYSTEM

BACKGROUND

A digital imaging system typically includes a lens for focusing an object image on an image sensor, such as a charge coupled device (CCD) or a complementary metal oxide semiconductor (CMOS) imaging device. The image sensor includes an array of monochromatic photo detectors aligned in rows along the x-direction and columns along the y-direction. Each photo detector in the array of photo detectors corresponds to one picture element, referred to as a pixel, in a graphic image. The lens directs light from the object image onto the photo detectors of the image sensor to excite the photo detectors. To capture an object image, the photo detectors are sampled by the imaging system electronics. The sampled data is processed to produce an image.

To capture a color image of the object image, a color filter array (CFA) is placed over the photo detectors of the image sensor. The CFA includes filters aligned in rows along the x-direction and columns along the y-direction. Each filter in the CFA is aligned over one photo detector of the image sensor. The CFA filters light directed from the lens toward the photo detectors. The filtered light strikes the photo detectors of the image sensor and the photo detectors are sampled by the imaging system electronics. The sampled data is processed to produce a color image.

Filters in the CFA are typically organized in a mosaic pattern that resembles a three color checkerboard. In one type of CFA, the three colors in the mosaic pattern are the three primary colors of red, green and blue. As a result, each pixel captures the intensity of one of the primary colors of red, green or blue. In another type of CFA, the three colors in the mosaic pattern are the secondary colors of magenta, yellow, and cyan. As a result, each pixel captures the intensity of one of the secondary colors of magenta, yellow, or cyan.

Imaging systems with three color mosaic based image sensors have inherent drawbacks. No matter how many pixels a three color mosaic based image sensor contains, the image sensor can only capture one color at each pixel. Imaging systems with three color mosaic based image sensors rely on complex processing to interpolate the remaining two-thirds of the colors that are not captured. This interpolation leads to a loss of color resolution and color artifacts. To compensate, some imaging systems intentionally blur images to reduce artifacts.

Some applications require more color resolution than that provided by a three color mosaic based image sensor. In applications, such as distinguishing color variations in a succession of objects or tracking color changes in a scene over time, three colors may not provide enough color resolution. These applications include determining the color of products on a conveyor belt, determining color differences in food produce, and control of ambient lighting. Also, three colors may not provide enough color resolution in applications such as color process control where color measurements are taken and quality control is an issue.

For these and other reasons there is a need for the present invention.

SUMMARY

One aspect of the present invention provides an imaging system comprising a filter array adapted to filter electromagnetic waves, a lens array adapted to focus electromagnetic waves, and an image sensor configured to receive the focused electromagnetic waves. The filter array and the lens array are configured into elements that filter and focus electromagnetic waves that represent an object image window onto portions of the image sensor and each portion of the image sensor receives filtered electromagnetic waves that represent the object image window from one of the elements.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
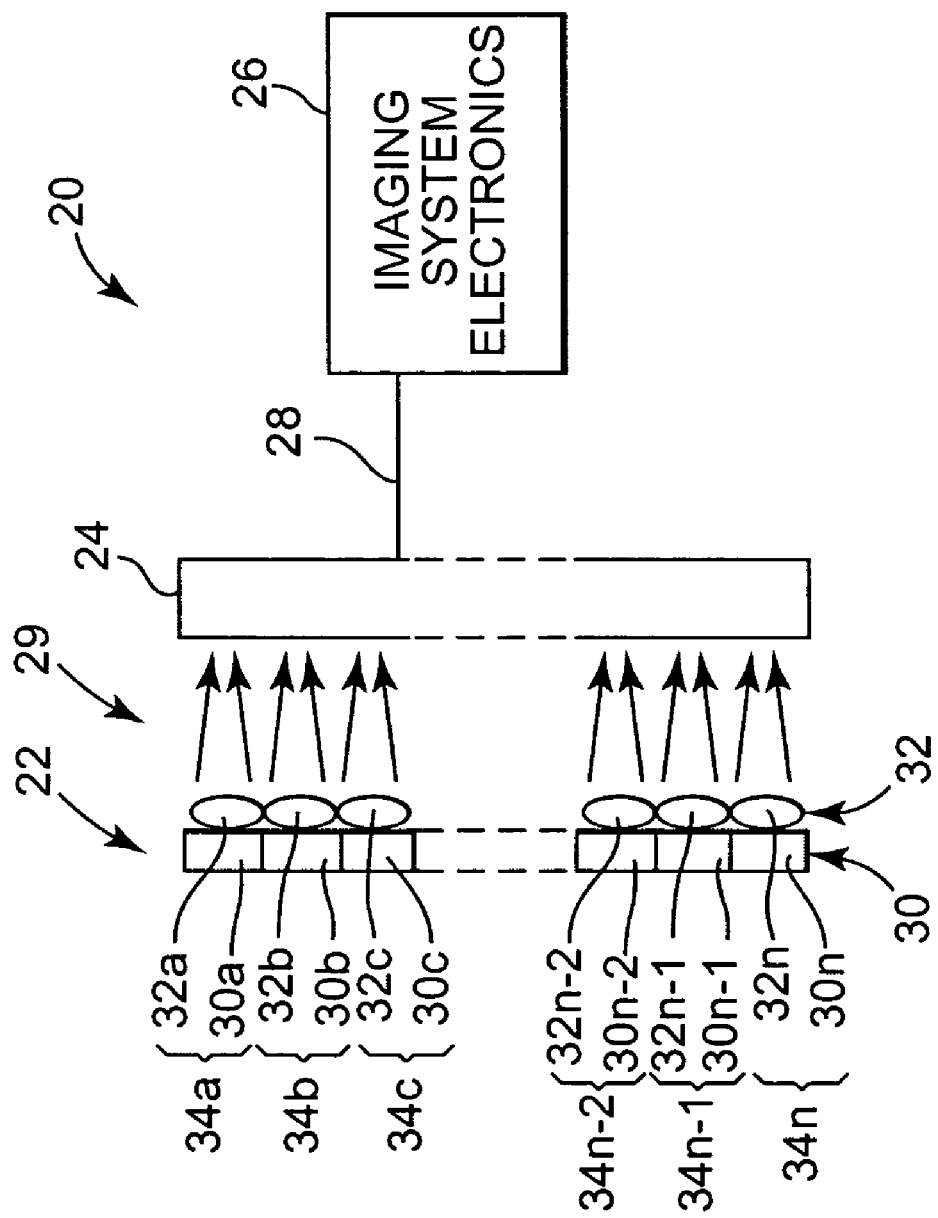
FIG. 1 is a diagram illustrating one embodiment of a multi-color imaging system.

FIG. 1 is a diagram illustrating one embodiment of a multi-color imaging system 20. The multi-color imaging system 20 senses a plurality of colors from an object image to enhance color resolution and capture-detailed color information. Multi-color imaging system 20 includes an element array 22, an image sensor 24, and imaging system electronics 26. Image sensor 24 is electrically coupled to imaging system electronics 26 via conductive path 28. Element array 22 filters and focuses electromagnetic waves, indicated at 29, from an object image onto image sensor 24. The imaging system electronics 26 samples image sensor 24 via conductive path 28 to obtain information about the object image.

Image sensor 24 is an image sensor, such as a charge coupled device (CCD) or a complementary metal oxide semiconductor (CMOS) imaging device. The image sensor 24 includes an array of photo detectors aligned in rows and columns. Each photo detector in the array of photo detectors corresponds to one pixel. In one embodiment, image sensor 24 includes monochromatic photo detectors. In one embodiment, image sensor 24 senses electromagnetic waves in the visible light spectrum. In one embodiment, image sensor 24 senses electromagnetic waves in the infrared spectrum. In other embodiments, image sensor 24 can be any suitable image sensor that senses electromagnetic waves in any suitable portion of the electromagnetic wave spectrum or the entire electromagnetic wave spectrum.

Imaging system electronics 26 is electronic hardware and software for controlling multi-color imaging system 20 and sampling image sensor 24. In one embodiment, imaging system electronics 26 includes a micro-processor and memory that stores a program. The micro-processor executes the program to control multi-color imaging system 20 and sample image sensor 24. In other embodiments, imaging system electronics 26 can be any suitable hardware and/or software, such as a micro-controller or an application specific integrated circuit.

Element array 22 includes a multi-color filter array 30 and a fly eye lens 32. Multi-color filter array 30 is situated in front of fly eye lens 32 and between an object image and fly eye lens 32. Electromagnetic waves from the object image are filtered by multi-color filter array 30 and fly eye lens 32 focuses the filtered waves onto image sensor 24. In another embodiment, multi-color filter array 30 is situated behind fly eye lens 32 and between fly eye lens 32 and image sensor 24, such that fly eye lens 32 focuses electromagnetic waves from the object image through multi-color filter array 30 and onto image sensor 24.

Element array 22 can be built in any suitable configuration. In one embodiment, multi-color filter array 30 and fly eye lens 32 are part of an integrated unit. In one embodiment, fly eye lens 32 includes one or more coatings, on the front and/or back of fly eye lens 32, that are part of multi-color filter array 30. In one embodiment, fly eye lens 32 includes pigments that are part of multi-color filter array 30. In one embodiment, multi-color filter array 30 is situated on the surface of image sensor 24 and between fly eye lens 32 and image sensor 24.

Multi-color filter array 30 includes n filters 30a-30n, and fly eye lens 32 includes n lenses 32a-32n. Filters 30a-30n are aligned in an array of rows and columns, and lenses 32a-32n are aligned in an array of rows and columns. Each of the filters 30a-30n is aligned with a corresponding one of the lenses 32a-32n. In one aspect, element array 22 includes elements 34a-34n aligned in an array of rows and columns. Each of the elements 34a-34n includes one of the filters 30a-30n and one of the lenses 32a-32n. For example, element 34a includes filter 30a and lens 32a, element 34b includes filter 30b and lens 32b, and so on, to element 34n that includes filter 30n and lens 32n.

Filters 30a-30n include at least four different filters. Each of the at least four different filters passes a different set of electromagnetic waves from the electromagnetic wave spectrum. Filters 30a-30n can be any suitable types of filters, such as band pass filters, high pass filters, low pass filters, and filters that pass non-continuous frequencies in the electromagnetic wave spectrum. In one embodiment, at least one of the filters 30a-30n passes electromagnetic waves in the visible light spectrum. In one embodiment, at least one of the filters 30a-30n passes electromagnetic waves in the infrared spectrum. In other embodiments, filters 30a-30n pass electromagnetic waves in any suitable portion of the electromagnetic wave spectrum or the entire electromagnetic wave spectrum.

Each of the lenses 32a-32n in fly eye lens 32 is a convex lens. In other embodiments, each of the lenses 32a-32n can be any suitable type of lens. In one embodiment, each of the lenses 32a-32n is a complex lens having a first lens in series with a second lens, such as a field flattener lens. The first lens and the second lens can be any suitable combination of convex and/or concave lenses and, in one embodiment, one of the filters 30a-30n is situated between the first lens and the second lens of each of the lenses 32a-32n.

In one embodiment, fly eye lens 32 includes lenses 32a-32n that focus electromagnetic waves in the visible light spectrum. In one embodiment, fly eye lens 32 includes lenses 32a-32n that focus electromagnetic waves in the infrared spectrum. In other embodiments, fly eye lens 32 includes lenses 32a-32n that focus electromagnetic waves in any suitable portion of the electromagnetic wave spectrum or the entire electromagnetic wave spectrum.

Each of the elements 34a-34n filters electromagnetic waves from the object image and focuses the filtered waves onto a portion of image sensor 24. In one embodiment, each of the elements 34a-34n focuses the filtered waves onto one photo detector in image sensor 24. In one embodiment, each of the elements 34a-34n focuses the filtered waves onto a plurality of photo detectors in image sensor 24.

In one embodiment, each of the elements 34a-34n receives a set of electromagnetic waves from the entire object image window. This set of electromagnetic waves from the entire object image window is filtered by each of the filters 30a-30n. Each of the lenses 32a-32n focuses filtered waves onto a portion of image sensor 24 that corresponds to that one of the lenses 32a-32n. Each portion of image sensor 24 includes a plurality of photo detectors and each of the elements 34a-34n focuses filtered waves representing the entire object image window onto the plurality of photo detectors in the corresponding portion of image sensor 24. In this embodiment, the set of electromagnetic waves from the entire object image is filtered by at least four different filters in filters 30a-30n and each of the at least four different filters provides a different set of filtered electromagnetic waves that represent the entire object image. The different sets of filtered electromagnetic waves are focused on different portions of image sensor 24 by lenses 32a-32n. Thus, multi-color imaging system 20 provides at least four different images of the object image to provide enhanced color resolution and capture detailed color information.

Figure 2:
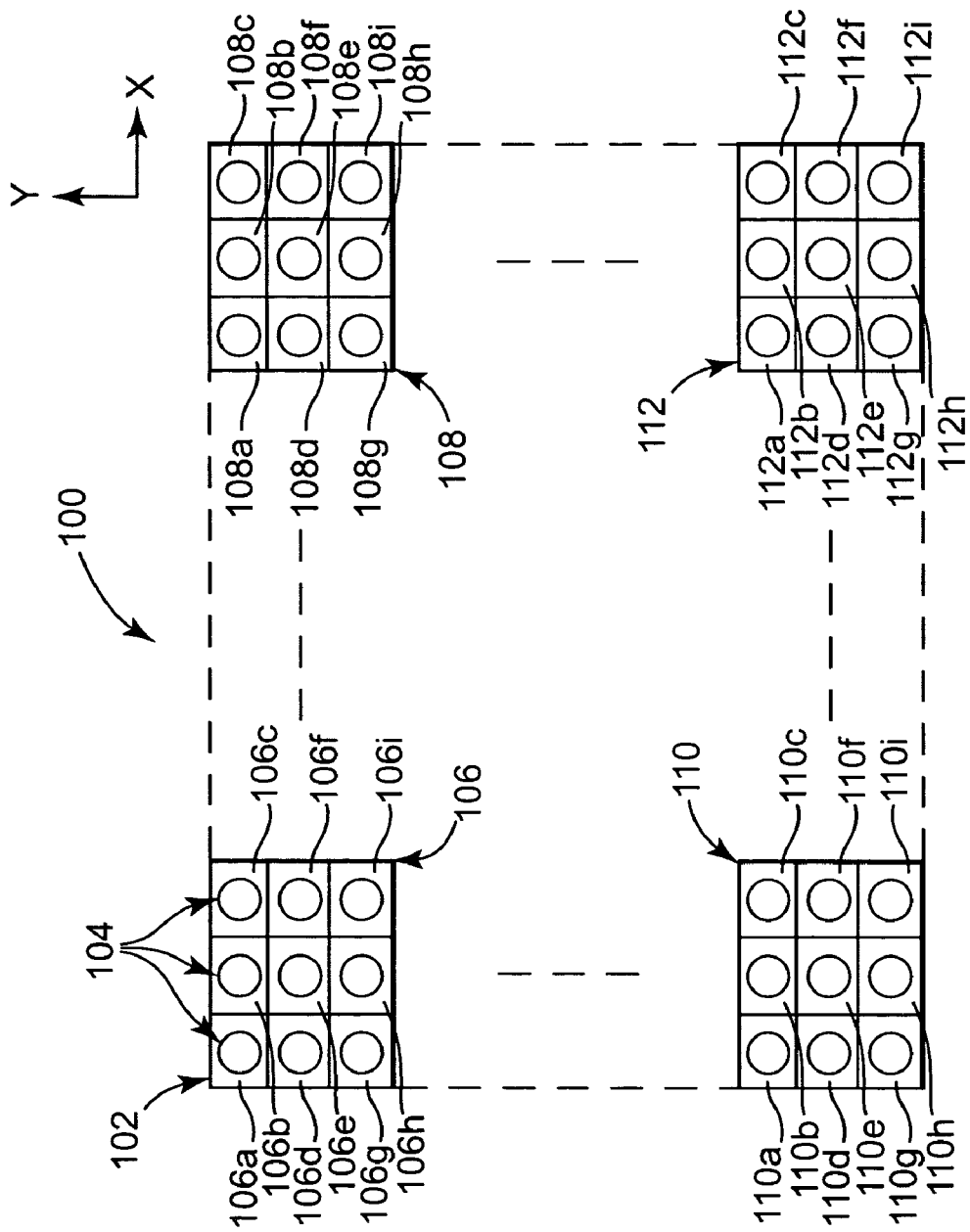
FIG. 2 is a diagram illustrating one embodiment of an element array in an imaging system.

FIG. 2 is a diagram illustrating one embodiment of an element array 100 in an imaging system 20. Element array 100 is similar to element array 22 (shown in FIG. 1). Element array 100 includes a multi-color filter array 102 located in front of a fly eye lens, indicated with circles at 104.

In one aspect, element array 100 includes an array of super pixels, such as super pixels 106, 108, 110 and 112. Element array 100 includes any suitable number of super pixels. In one embodiment, each of the super pixels in element array 100 is similar to any of the other super pixels in element array 100. In one embodiment, super pixels in element array 100 are aligned in rows along the x direction and columns along the y direction. In other embodiments, super pixels can be organized into any suitable arrangement.

Each of the super pixels 106, 108, 110 and 112 includes nine elements, indicated at 106a-106i, 108a-108i, 110a-110i, and 112a-112i. Elements 106a-106i, 108a-108i, 110a-110i, and 112a-112i are arranged in rows along the x direction and columns along the y direction. In other embodiments, each of the super pixels can include any suitable number of elements and the elements can be organized into any suitable arrangement.

Each of the elements 106a-106i, 108a-108i, 110a-110i, and 112a-112i focuses filtered electromagnetic waves onto an image sensor, such as image sensor 24 (shown in FIG. 1). In one embodiment, each of the elements 106a-106i, 108a-108i, 110a-110i, and 112a-112i focuses filtered electromagnetic waves onto one photo detector of an image sensor, such as image sensor 24. In one embodiment, each of the elements 106a-106i, 108a-108i, 110a-110i, and 112a-112i focuses filtered electromagnetic waves onto a plurality of photo detectors of an image sensor, such as image sensor 24.

Each of the elements 106a-106i, 108a-108i, 110a-110i, and 112a-112i is similar to each of the elements 34a-34n (shown in FIG. 1), and includes a filter from multi-color filter array 102 and a lens from fly eye lens 104. Each of the elements 106a, 108a, 110a, and 112a include a filter from the multi-color filter array 102 that passes electromagnetic waves in a first pass band. Each of the elements 106b, 108b, 110b, and 112b include a filter from the multi-color filter array 102 that passes electromagnetic waves in a second pass band. Each of the elements 106c, 108c, 110c, and 112c include a filter from the multi-color filter array 102 that passes electromagnetic waves in a third pass band. Each of the elements 106d, 108d, 110d, and 112d include a filter from the multi-color filter array 102 that passes electromagnetic waves in a fourth pass band. Each of the elements 106e, 108e, 110e, and 112e include a filter from the multi-color filter array 102 that passes electromagnetic waves in a fifth pass band. Each of the elements 106f, 108f, 110f, and 112f include a filter from the multi-color filter array 102 that passes electromagnetic waves in a sixth pass band. Each of the elements 106g, 108g, 110g, and 112g include a filter from the multi-color filter array 102 that passes electromagnetic waves in a seventh pass band. Each of the elements 106h, 108h, 110h, and 112h include a filter from the multi-color filter array 102 that passes electromagnetic waves in an eighth pass band, and each of the elements 106i, 108i, 110i, and 112i include a filter from the multi-color filter array 102 that passes electromagnetic waves in a ninth pass band.

Each of the nine types of elements, indicated a-i, pass a different set of wavelengths from the electromagnetic wave spectrum. Also, each of the nine types of elements a-i includes filters that are band pass filters, as opposed to low pass or high pass filters. In other embodiments, each of the filters can be any suitable type of filter, such as a low pass filter, a high pass filter, a band pass filter, and a filter that passes non-continuous frequencies in the electromagnetic wave spectrum, and each of the filters can pass any suitable wavelengths from the electromagnetic wave spectrum.

Each super pixel 106, 108, 110, and 112 receives electromagnetic waves from a corresponding area or point on an object image. Each of the nine elements of one of the super pixels 106, 108, 110, and 112 receives electromagnetic waves from the same corresponding area of the object image. Thus, each of the nine elements 106a-106i of super pixel 106, filter and focus electromagnetic waves from the corresponding area of the object image focused on by super pixel 106. Each of the nine elements 108a-108i of super pixel 108, filter and focus electromagnetic waves from the corresponding area of the object image focused on by super pixel 108. Each of the nine elements 110a-110i of super pixel 10, filter and focus electromagnetic waves from the corresponding area of the object image focused on by super pixel 110, and each of the nine elements 112a-112i of super pixel 112, filter and focus electromagnetic waves from the corresponding area of the object image focused on by super pixel 112. As a result, the imaging system captures nine different colors or sets of filtered electromagnetic waves from each area of the object image focused on by a super pixel to enhance the color resolution of the imaging system.

Figure 3:
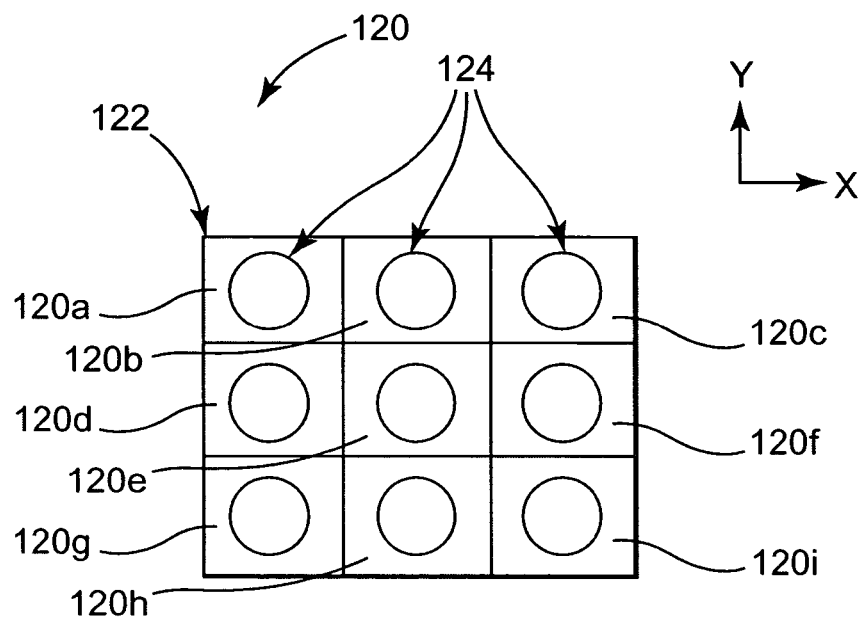
FIG. 3 is a diagram illustrating one embodiment of a super pixel.

FIG. 3 is a diagram illustrating one embodiment of a super pixel 120. Super pixel 120 is similar to each of the super pixels 106, 108, 110, and 112 in element array 100 of FIG. 2. Super pixel 120 includes a multi-color filter array 122 located in front of a fly eye lens, indicated with circles at 124.

Super pixel 120 includes nine elements, indicated at 120a-120i. Each of the elements 120a-120i is similar to each of the elements 34a-34n (shown in FIG. 1), and includes a filter from multi-color filter array 122 and a lens from fly eye lens 124. The elements 120a-120i are arranged in rows along the x direction and columns along the y direction. In one embodiment, each of the elements 120a-120i is rectangular. In one embodiment, each of the elements 120a-120i is hexagonal. In other embodiments, super pixel 120 can include any suitable number of elements in any suitable shape and organized in any suitable arrangement.

Each of the elements 120a-120i focuses filtered electromagnetic waves onto an image sensor, such as image sensor 24 (shown in FIG. 1). In one embodiment, each of the elements 120a-120i focuses filtered electromagnetic waves onto one photo detector of an image sensor. In one embodiment, each of the elements 120a-120i focuses filtered electromagnetic waves onto a plurality of photo detectors of an image sensor.

Each of the elements 120a-120i receives electromagnetic waves, such as visible light, from one area or point on an object image located in an object plane. Each of the elements 120a-120i is small, which reduces parallax between elements 120a-120i from the area in the object plane. With small elements 120a-120i, the object plane can be situated close to super pixel 120, while each of the elements 120a-120i receives electromagnetic waves from the one area or point. In one embodiment, each of the elements 120a-120i is about 3 microns on a side. In other embodiments, each of the elements 120a-120i can be from 3 to 15 microns on a side. In one embodiment, each of the elements 120a-120i is shifted to receive light from one area or point in the object plane. In one embodiment, imaging system optics, such as apertures, focus light from one area or point in the object plane onto the elements 120a-120i.

Each of the elements 120a-120i includes a band pass filter that passes selected colors or wavelengths of light. In one embodiment, element 120a includes a filter from multi-color filter array 122 that passes electromagnetic waves in a dark red pass band. Element 120b includes a filter from multi-color filter array 122 that passes electromagnetic waves in a light red pass band. Element 120c includes a filter from multi-color filter array 122 that passes electromagnetic waves in a light blue pass band. Element 120d includes a filter from multi-color filter array 122 that passes electromagnetic waves in a dark blue. Element 120e includes a filter from multi-color filter array 122 that passes electromagnetic waves in a dark green pass band. Element 120f includes a filter from multi-color filter array 122 that passes electromagnetic waves in a light green pass band. Element 120g includes a filter from multi-color filter array 122 that passes electromagnetic waves in a yellow pass band. Element 120h includes a filter from multi-color filter array 122 that passes electromagnetic waves in an orange pass band, and element 120i includes a filter from multi-color filter array 122 that passes white light.

Each of the nine pass bands passes a different set of wavelengths from the electromagnetic wave spectrum. Also, each of the nine filters is a band pass filter, as opposed to a low pass filter or a high pass filter. In one embodiment, at least one of the elements 120a-120i passes light in the infrared range. In one embodiment, at least one of the elements 120a-120i passes light in the ultra-violet range. In other embodiments, each of the nine filters can be any suitable type of filter, such as a low pass filter, a high pass filter, a band pass filter, and a filter that passes non-continuous frequencies in the electromagnetic wave spectrum, and each of the nine filters can pass any suitable wavelengths from the electromagnetic wave spectrum.

Super pixel 120 receives electromagnetic waves from one area or point on an object image in an object plane, such that each of the nine elements 120a-120i receives electromagnetic waves from the one area of the object plane. Each of the nine elements 120a-120i filters and focuses electromagnetic waves from the one area of the object plane onto an image sensor, such as image sensor 24. As a result, the imaging system captures nine different colors from the one area of the object plane to enhance the color resolution of the imaging system.

Figure 4:
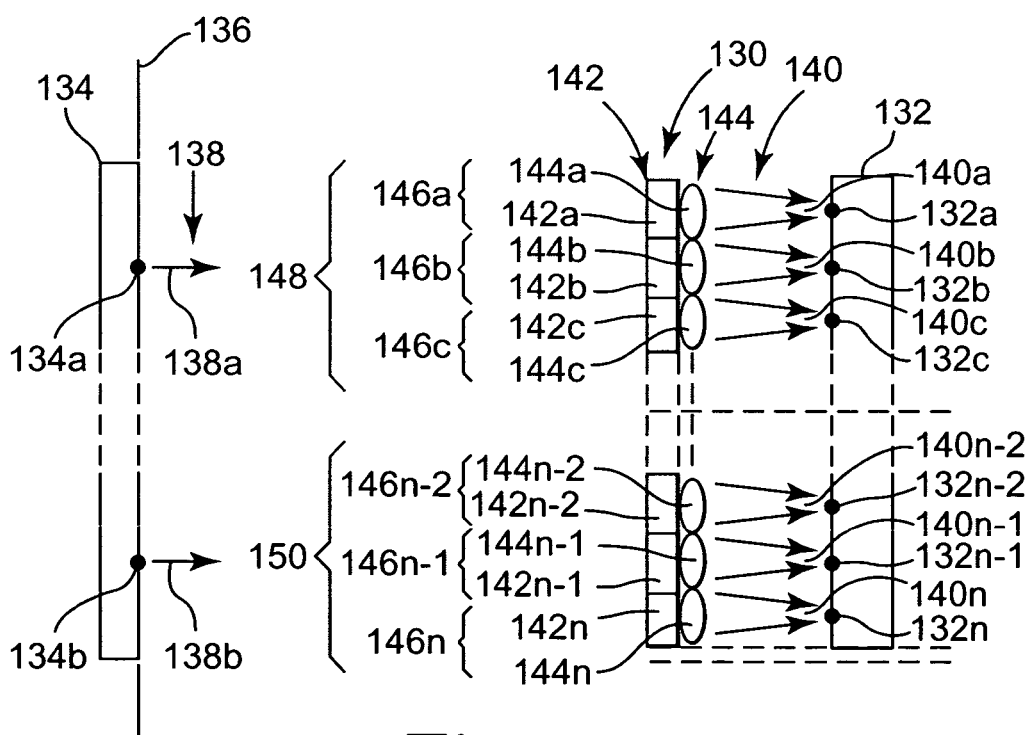
FIG. 4 is a diagram illustrating one embodiment of an element array and an image sensor sensing an object image.

FIG. 4 is a diagram illustrating one embodiment of an element array 130 and an image sensor 132 sensing an object image 134. The element array 130 and image sensor 132 are part of a multi-color imaging system similar to multi-color imaging system 20 of FIG. 1. Image sensor 132 is similar to image sensor 24 (shown in FIG. 1) and element array 130 is similar to element array 22 (shown in FIG. 1) and element array 100 of FIG. 2. Element array 130 and image sensor 132 sense object images, such as object image 134, situated in an object plane 136. Element array 130 filters electromagnetic waves 138 from object image 134 and focuses filtered electromagnetic waves 140 onto image sensor 132.

Image sensor 132 includes n photo detectors 132a-132n in an array of photo detectors 132a-132n aligned in rows and columns. Each of the photo detectors 132a-132n corresponds to one pixel. Image sensor 132 is an image sensor, such as a charge coupled device (CCD) or a complementary metal oxide semiconductor (CMOS) imaging device. In one embodiment, image sensor 132 includes monochromatic photo detectors. In one embodiment, image sensor 132 senses electromagnetic waves in the visible light spectrum. In one embodiment, image sensor 132 senses electromagnetic waves in the infrared spectrum. In other embodiments, image sensor 132 can be any suitable image sensor that senses electromagnetic waves in any suitable portion of the electromagnetic wave spectrum or the entire electromagnetic wave spectrum.

Element array 130 includes a multi-color filter array 142 and a fly eye lens 144. Multi-color filter array 142 is situated in front of fly eye lens 144 and between object image 134 and fly eye lens 144. Electromagnetic waves 138 from object image 134 are filtered by multi-color filter array 142. Fly eye lens 144 focuses the filtered electromagnetic waves 140 onto image sensor 132. In another embodiment, multi-color filter array 142 is situated behind fly eye lens 144 and between fly eye lens 144 and image sensor 132, such that fly eye lens 144 focuses electromagnetic waves from the object image 134 through multi-color filter array 142 and onto image sensor 132.

Element array 130 can be built in any suitable configuration. In one embodiment, multi-color filter array 142 and fly eye lens 144 are part of an integrated unit. In one embodiment, the fly eye lens 144 includes one or more coatings that are part of the multi-color filter array 142. In one embodiment, the fly eye lens 144 includes pigments that are part of the multi-color filter array 142. In one embodiment, multi-color filter array 142 is situated on the surface of image sensor 132 and between fly eye lens 144 and image sensor 132.

Multi-color filter array 142 includes n filters 142a-142n and fly eye lens 144 includes n lenses 144a-144n. Filters 142a-142n are aligned in an array of rows and columns and lenses 144a-144n are aligned in an array of rows and columns. Each of the filters 142a-142n is aligned with a corresponding one of the lenses 144a-144n. In one aspect, element array 130 includes elements 146a-146n aligned in an array of rows and columns. Each of the elements 146a-146n includes one of the filters 142a-142n and one of the lenses 144a-144n. For example, element 146a includes filter 142a and lens 144a, element 146b includes filter 142b and lens 144b, and so on, to element 146n including filter 142n and lens 144n. Each of the elements 146a-146n filters electromagnetic waves 138 and focuses filtered electromagnetic waves 140 onto image sensor 132.

In one aspect, element array 130 includes an array of super pixels, such as super pixels indicated at 148 and 150. Each of the super pixels 148 and 150 is similar to any of the super pixels 106, 108, 110, and 112 (shown in FIG. 2). Super pixel 148 includes elements 146a-146c and super pixel 150 includes elements 146n-2 to 146n. Element array 130 includes any suitable number of super pixels. In one embodiment, each of the super pixels in element array 130 is similar to any of the other super pixels in element array 130. In one embodiment, super pixels in element array 130 are aligned in rows along the x direction and columns along the y direction. In other embodiments, super pixels can be organized into any suitable arrangement.

Each of the super pixels 148 and 150 receives electromagnetic waves from a corresponding area or point on object image 134, such that each of the nine elements of one of the super pixels 148 and 150 receives electromagnetic waves from the same corresponding area on object image 134. Super pixel 148 receives electromagnetic waves from a point at 134a on object image 134, and super pixel 150 receives electromagnetic waves from a point at 134b on object image 134.

Each of the nine elements, including elements 146a-146c, of super pixel 148 receives electromagnetic waves 138a from point 134a on object image 134. Element 146a filters the received electromagnetic waves 138a and focuses filtered electromagnetic waves 140a on photo detector 132a. Element 146b filters the received electromagnetic waves 138a and focuses filtered electromagnetic waves 140b on photo detector 132b, and element 146c filters the received electromagnetic waves 138a and focuses filtered electromagnetic waves 140c on photo detector 132c. The nine elements of super pixel 148 filter electromagnetic waves 138a and focus filtered electromagnetic waves, such as filtered electromagnetic waves 140a-140c, onto image sensor 132.

Each of the nine elements, including elements 146n-2 to 146n, of super pixel 150 receives electromagnetic waves 138b from point 134b on object image 134. Element 146n-2 filters the received electromagnetic waves 138b and focuses filtered electromagnetic waves 140n-2 on photo detector 132n-2. Element 146n-1 filters the received electromagnetic waves 138b and focuses filtered electromagnetic waves 140n-1 on photo detector 132n-1, and element 146n filters received electromagnetic waves 138b and focuses filtered electromagnetic waves 140n on photo detector 132n. The nine elements of super pixel 150 filter electromagnetic waves 138b and focus filtered electromagnetic waves, such as filtered electromagnetic waves 140n-2 to 140n, onto image sensor 132.

The imaging system captures nine different colors or sets of electromagnetic waves from each area 134a and 134b to enhance the color resolution of the imaging system. Each of the elements 146a-146n focuses filtered electromagnetic waves 140a-140n onto one of the photo detectors 132a-132n. As a result, the image sensor 132 can be situated close to element array 130 and the overall width of the device can be small. In addition, each of the elements 146a-146n is small, which reduces parallax between elements 146a-146n and the object plane can be situated close to element array 130. In one embodiment, the overall width of the element array 130 and image sensor 132 is about 1 millimeter.

Figure 5:
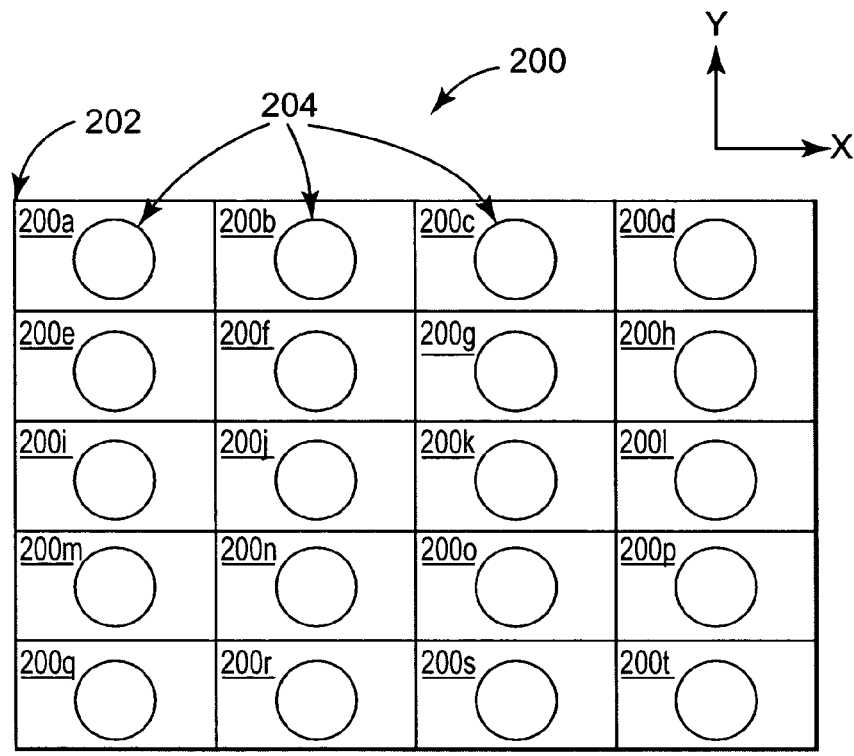
FIG. 5 is a diagram illustrating one embodiment of an element array in an imaging system.

FIG. 5 is a diagram illustrating one embodiment of an element array 200 in an imaging system, such as imaging system 20 of FIG. 1. Element array 200 is similar to element array 22 (shown in FIG. 1). Element array 200 includes a multi-color filter array 202 located in front of a fly eye lens, indicated with circles at 204. In one aspect, element array 200 includes an array of twenty elements 200a-200t. The elements 200a-200t are arranged in rows along the x direction and columns along the y direction. In one embodiment, each of the elements 200a-200t is rectangular. In one embodiment, each of the elements 200a-200t is hexagonal. In other embodiments, element array 200 can include any suitable number of elements in any suitable shape and organized in any suitable arrangement.

Each of the elements 200a-200t is similar to each of the elements 34a-34n (shown in FIG. 1), and includes a filter from multi-color filter array 202 and a lens from fly eye lens 204. In one embodiment, each of the elements 200a-200t includes a filter from the multi-color filter array 202 that passes electromagnetic waves in a different pass band, as compared to each of the other elements 200a-200t. In other embodiments, each of the elements 200a-200t includes a filter from the multi-color filter array 202 that passes electromagnetic waves in the same or a different pass band, as compared to each of the other elements 200a-200t.

In one embodiment, at least one of the elements 200a-200t passes electromagnetic waves in the visible light range. In one embodiment, at least one of the elements 200a-200t passes electromagnetic waves in the infrared range. In one embodiment, at least one of the elements 200a-200t passes light in the ultra-violet range. Also, in one embodiment, each of the twenty filters is a band pass filter, as opposed to a low pass filter or a high pass filter. In other embodiments, each of the twenty filters can be any suitable type of filter, such as a low pass filter, a high pass filter, a band pass filter, and a filter that passes non-continuous frequencies in the electromagnetic wave spectrum, and each of the filters can pass any suitable wavelengths from the electromagnetic wave spectrum.

Each of the elements 200a-200t receives electromagnetic waves from an area of an object image, filters the received electromagnetic waves, and focuses the filtered electromagnetic waves on the image sensor, such as image sensor 24 (shown in FIG. 1). In one embodiment, each of the elements 200a-200t is shifted to receive electromagnetic waves from the area of the object image. In one embodiment, imaging system optics, such as apertures, focus electromagnetic waves from the area of the object image onto the elements 200a-200t.

In one embodiment, each of the elements 200a-200t receives electromagnetic waves from one area of the object image. As a result, the imaging system captures twenty colors or sets of filtered electromagnetic waves from the one area of the object image. In one embodiment, each of the elements 200a-200t receives electromagnetic waves from a different area of the object image, as compared to each of the other elements 200a-200t. In one embodiment, a group of elements 200a-200t receives electromagnetic waves from the same area of the object image. In other embodiments, each of the elements 200a-200t receives electromagnetic waves from any suitable area of the object image.

Each of the elements 200a-200t focuses the filtered electromagnetic waves onto a plurality of photo detectors in the image sensor. In one embodiment, each of the twenty elements 200a-200t focuses the filtered electromagnetic waves onto a different group of 120,000 photo detectors that is a 300 by 400 array of photo detectors. Element 200a focuses filtered electromagnetic waves onto a first group of 120,000 photo detectors, element 200b focuses filtered electromagnetic waves onto a second group of 120,000 photo detectors, and so on, up to element 200t that focuses filtered electromagnetic waves onto a twentieth group of 120,000 photo detectors. Each of the twenty groups of 120,000 photo detectors includes different photo detectors, such that element array 200 focuses electromagnetic waves onto 2.4 million photo detectors in the image sensor. In other embodiments, each of the twenty elements 200a-200t focuses the filtered electromagnetic waves onto a group of any suitable number of photo detectors organized in any suitable arrangement.

Figure 6:
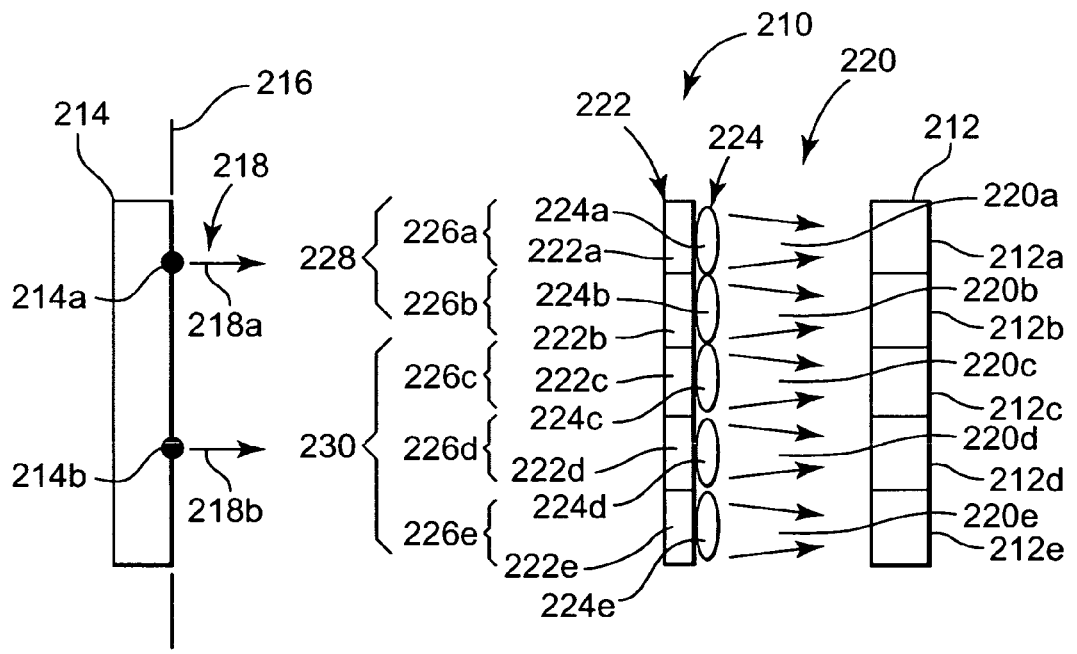
FIG. 6 is a diagram illustrating one embodiment of an element array and an image sensor sensing an object image.

FIG. 6 is a diagram illustrating one embodiment of an element array 210 and an image sensor 212 sensing an object image 214. The element array 210 and image sensor 212 are part of a multi-color imaging system, similar to multi-color imaging system 20 of FIG. 1. Image sensor 212 is similar to image sensor 24 (shown in FIG. 1) and element array 210 is similar to element array 22 (shown in FIG. 1) and element array 200 of FIG. 5. Element array 210 and image sensor 212 sense object images, such as object image 214, situated in an object plane 216. Element array 210 filters electromagnetic waves 218 from object image 214 and focuses filtered electromagnetic waves 220 onto image sensor 212.

Image sensor 212 includes twenty groups of photo detectors, such as photo detector groups 212a-212e. The twenty photo detector groups are aligned in rows and columns. Each of the photo detector groups, such as photo detector groups 212a-212e, includes 120,000 photo detectors in a 300 by 400 photo detector array. In other embodiments, image sensor 212 includes any suitable number of photo detector groups and any suitable number of photo detectors in each photo detector group.

Image sensor 212 is an image sensor, such as a charge coupled device (CCD) or a complementary metal oxide semiconductor (CMOS) imaging device. In one embodiment, image sensor 212 includes monochromatic photo detectors. In one embodiment, image sensor 212 senses electromagnetic waves in the visible light spectrum. In one embodiment, image sensor 212 senses electromagnetic waves in the infrared spectrum. In other embodiments, image sensor 212 can be any suitable image sensor that senses electromagnetic waves in any suitable portion of the electromagnetic wave spectrum or the entire electromagnetic wave spectrum.

Element array 210 includes a multi-color filter array 222 and a fly eye lens 224. Multi-color filter array 222 is situated in front of fly eye lens 224 and between object image 214 and fly eye lens 224. Electromagnetic waves 218 from object image 214 are filtered by multi-color filter array 222. Fly eye lens 224 focuses the filtered electromagnetic waves 220 onto image sensor 212. In another embodiment, multi-color filter array 222 is situated behind fly eye lens 224 and between fly eye lens 224 and image sensor 212, such that fly eye lens 224 focuses electromagnetic waves from the object image through multi-color filter array 222 and onto image sensor 212.

Element array 210 can be built in any suitable configuration. In one embodiment, multi-color filter array 222 and fly eye lens 224 are part of an integrated unit. In one embodiment, the fly eye lens 224 includes one or more coatings that are part of the multi-color filter array 222. In one embodiment, the fly eye lens 224 includes pigments that are part of the multi-color filter array 222. In one embodiment, multi-color filter array 222 is situated on the surface of image sensor 212 and between fly eye lens 224 and image sensor 212.

Multi-color filter array 222 includes twenty filters, such as filters 222a-222e, and fly eye lens 224 includes twenty lenses, such as lenses 224a-224e. The filters are aligned in rows and columns and the lenses are aligned in rows and columns. Each of the filters, such as filters 222a-222e, is aligned with a corresponding one of the lenses, such as lenses 224a-224e. In one aspect, element array 210 includes elements, such as elements 226a-226e, aligned in rows and columns. Each of the elements includes one of the filters and one of the lenses. For example, element 226a includes filter 222a and lens 224a, element 226b includes filter 222b and lens 224b, and so on, to element 226e that includes filter 222e and lens 224e. Each of the elements 226a-226e filters electromagnetic waves 218 and focuses filtered electromagnetic waves 220 onto image sensor 212.

In one aspect, element array 210 includes groups of elements 228 and 230. Each of the groups of elements 228 and 230 receives electromagnetic waves from a corresponding area or point on object image 214. Element group 228 receives electromagnetic waves from the area at 214a on object image 214 and element group 230 receives electromagnetic waves from the area at 214b on object image 214. Element group 228 includes elements 226a-226b and element group 230 includes elements 226c-226e. Element array 210 includes any suitable number of element groups and each element group includes any suitable number of elements.

Elements 226a-226b of element group 228 receive electromagnetic waves 218a from point 214a on object image 214. Element 226a filters the received electromagnetic waves 218a and focuses filtered electromagnetic waves 220a on photo detector group 212a. Element 226b filters the received electromagnetic waves 218a and focuses filtered electromagnetic waves 220b on photo detector group 212b.

Elements 226c-226e of element group 230 receive electromagnetic waves 218b from point 214b on object image 214. Element 226c filters the received electromagnetic waves 218b and focuses filtered electromagnetic waves 220c on photo detector group 212c. Element 226d filters the received electromagnetic waves 218b and focuses filtered electromagnetic waves 220d on photo detector group 212d. Element 226e filters the received electromagnetic waves 218b and focuses filtered electromagnetic waves 220e on photo detector group 212e.

The imaging system captures twenty colors or sets of electromagnetic waves from the object image 214, such as from areas 214a and 214b, to enhance the color resolution of the imaging system. In other embodiments, each of the elements in element array 210 can be focused on a single area on the object image to provide twenty sets of electromagnetic waves for the single area of the object image.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An imaging system comprising:
   a filter array adapted to filter electromagnetic waves;
   a lens array adapted to focus electromagnetic waves; and
   an image sensor configured to receive the focused electromagnetic waves, wherein the filter array and the lens array are configured into elements that filter and focus electromagnetic waves that represent an object image window onto portions of the image sensor, wherein each portion of the image sensor receives filtered electromagnetic waves that represent the object image window from one of the elements, and
   each element that filters and focuses includes:
   (a) at least four different band pass filters that pass selected colors or wavelengths of light from one point in an object plane,
   (b) at least four corresponding fly eye lenses aligned with the at least four different band pass filters for focusing the at least four selected colors or wavelengths of light from the one point onto at least four corresponding photo detectors of the image sensor; and
   each element defines a super pixel for filtering and focusing the at least four selected colors or wavelengths of light from the one point in the object plane onto the at least four corresponding photo detectors of the image sensor.

2. The imaging system of claim 1, wherein the image sensor comprises a plurality of photo detectors and each lens in the lens array is part of one of the elements and configured to focus the electromagnetic waves that represent the object image window onto one of the plurality of photo detectors.

3. The imaging system of claim 1, wherein the image sensor comprises a plurality of photo detectors and each lens in the lens array is part of one of the elements and configured to focus the electromagnetic waves that represent the object image window onto at least two of the plurality of photo detectors.

4. An imaging system comprising:
   a filter array having a plurality of filters; and
   fly eye lenses wherein the filter array and the fly eye lenses are configured into a first set of elements that receive a first set of electromagnetic waves from a first area of an object plane and each element of the first set of elements includes one of the fly eye lenses and one of the filters from the plurality of filters to image the first area of the object plane onto a portion of an image sensor, and
   each element includes:
   (a) at least four different band pass filters that pass selected colors or wavelengths of light from one point in an object plane,
   (b) at least four corresponding fly eye lenses aligned with the at least four different band pass filters for focusing the at least four selected colors or wavelengths of light from the one point onto at least four corresponding photo detectors of the image sensor; and
   each element defines a super pixel for filtering and focusing the at least four selected colors or wavelengths of light from the one point in the object plane onto the at least four corresponding photo detectors of the image sensor.

5. The imaging system of claim 4, wherein the filter array and the fly eye lenses are configured into a second set of elements that receive a second set of electromagnetic waves from a second area of the object plane and each element of the second set of elements includes one of the fly eye lenses and one of the filters from the plurality of filters to image the second area of the object plane.

6. The imaging system of claim 5, wherein a first filter in the first set of elements and a second filter in the second set of elements pass the same set of electromagnetic waves.

7. The imaging system of claim 4, wherein each filter in the plurality of filters is configured to pass a different sent of electromagnetic waves, as compared to each of the other filters in the plurality of filters.

8. The imaging system of claim 4, wherein at least one element of the first set of elements in configured to focus electromagnetic waves to provide one pixel of image data.

9. The imaging system of claim 4, wherein at least one element of the first set of elements is configured to focus electromagnetic waves to provide a plurality of pixels of image data.

10. The imaging system of claim 4, wherein at least one fly eye lens is a single convex lens adapted to concentrate electromagnetic waves.

11. The imaging system of claim 4, wherein at least one fly eye lens is a complex lens having a first lens in series with a second lens.

12. The imaging system of claim 4, wherein at least one element of the first set of elements includes a band pass filter adapted to filter electromagnetic waves from the first area of the object plane.

13. The imaging system of claim 4, wherein at least one element of the first set of elements includes one of a low pass filter, a high pass filter, and a filter that passes non-continuous frequencies in the electromagnetic wave spectrum.

14. The imaging system of claim 4, wherein at least one element of the first set of elements is one of rectangular shaped and hexagonal shaped.

15. A method of imaging an object, comprising:
receiving electromagnetic waves that represent the object at an element array;
filtering the received electromagnetic waves that represent the object with each element in the element array; and
focusing the received electromagnetic waves that represent the object with each element in the element array onto a different portion of an image sensor with each element in the element arrays,
each element that filters and focuses includes:
  (a) at least four different band pass filters that pass selected colors or wavelengths of light from one point in an object plane,
  (b) at least four corresponding fly eye lenses aligned with the at least four different band pass filters for focusing the at least four selected colors or wavelengths of light from the one point onto at least four corresponding photo detectors of the image sensor, and
each element defines a super pixel for filtering and focusing the at least four selected colors or wavelengths of light from the one point in the object plane onto the at least four corresponding photo detectors of the image sensor.

16. The method of claim 15, wherein filtering the received electromagnetic waves comprises:
filtering the received electromagnetic waves with each filter in an array of filters to provide a different set of filtered electromagnetic waves from each filter in the array of filters.

17. The method of claim 15, wherein focusing the received electromagnetic waves comprises:
focusing electromagnetic waves onto a separate photo detector in the image sensor with each fly eye lens.

18. The method of claim 15, wherein focusing the received electromagnetic waves comprises:
focusing electromagnetic waves onto a plurality of photo detectors in the image sensor with each fly eye lens.

19. The method of claim 15, wherein filtering the received electromagnetic waves comprises:
passing the electromagnetic waves through at least four different filters in an array of filters to provide at least four different sets of electromagnetic wave.

* * * * *